US011158782B2

(12) United States Patent
Haight et al.

(10) Patent No.: US 11,158,782 B2
(45) Date of Patent: Oct. 26, 2021

(54) METAL FLUORIDE ENCAPSULATION OF SUPERCONDUCTING DEVICES

(71) Applicant: International Business Machines Corporation, Armonk, NY (US)

(72) Inventors: Richard Alan Haight, Mahopac, NY (US); Vivekananda P. Adiga, Ossining, NY (US); Martin O. Sandberg, Ossining, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 16/681,331

(22) Filed: Nov. 12, 2019

(65) Prior Publication Data
US 2021/0143314 A1 May 13, 2021

(51) Int. Cl.
*H01L 39/24* (2006.01)
*H01L 39/12* (2006.01)
*H01L 39/22* (2006.01)

(52) U.S. Cl.
CPC .......... *H01L 39/2493* (2013.01); *H01L 39/12* (2013.01); *H01L 39/223* (2013.01)

(58) Field of Classification Search
CPC .... H01L 39/2493; H01L 39/12; H01L 39/223
See application file for complete search history.

(56) References Cited

U.S. PATENT DOCUMENTS

| 4,127,452 | A | 11/1978 | Martens et al. |
| 4,965,244 | A * | 10/1990 | Weaver ............... C23C 14/0021 427/62 |
| 5,155,094 | A | 10/1992 | Okabe et al. |
| 5,869,846 | A | 2/1999 | Higashino et al. |
| 6,238,774 | B1 * | 5/2001 | Park ...................... C04B 41/009 428/195.1 |
| 6,506,814 | B2 | 1/2003 | Krongauz et al. |
| 8,189,980 | B2 | 5/2012 | Miyazaki et al. |
| 8,951,808 | B2 | 2/2015 | Ladizinsky et al. |
| 9,455,073 | B2 | 9/2016 | Barabash et al. |
| 9,971,970 | B1 | 5/2018 | Rigetti et al. |

(Continued)

FOREIGN PATENT DOCUMENTS

| CN | 1838439 A | 9/2006 |
| KR | 101142847 B1 | 5/2012 |
| WO | 2015067933 A1 | 5/2015 |

OTHER PUBLICATIONS

Kjaergaard, et al. "Superconducting Qubits: Current State of Play." arXiv:1905.13641v2 [quant-ph] Jul. 26, 2019. 28 pages.

(Continued)

*Primary Examiner* — Matthew L Reames
(74) *Attorney, Agent, or Firm* — Amin, Turocy & Watson, LLP

(57) ABSTRACT

Techniques regarding encapsulating one or more superconducting devices of a quantum processor are provided. For example, one or more embodiments described herein can regard a method that can comprise depositing a metal fluoride layer onto a superconducting resonator and a silicon substrate that can be comprised within a quantum processor. The superconducting resonator can be positioned on the silicon substrate. Also, the metal fluoride layer can coat the superconducting resonator.

20 Claims, 10 Drawing Sheets

(56) References Cited

U.S. PATENT DOCUMENTS

| | | |
|---|---|---|
| 10,208,148 B2 | 2/2019 | Corten et al. |
| 10,403,808 B2 | 9/2019 | Megrant |
| 2009/0181315 A1 | 7/2009 | Spatz et al. |
| 2015/0017432 A1 | 1/2015 | Shoseyov et al. |
| 2016/0221825 A1* | 8/2016 | Allen ................. G01R 33/0354 |
| 2016/0254434 A1 | 9/2016 | McDermott, III et al. |
| 2019/0042964 A1 | 2/2019 | Elsherbini et al. |
| 2019/0047258 A1 | 2/2019 | Suematsu et al. |
| 2019/0164077 A1* | 5/2019 | Roberts ............... H01L 39/2493 |
| 2020/0364600 A1 | 11/2020 | Elsherbini et al. |

OTHER PUBLICATIONS

Appendix P: List of IBM Patents or Applications Treated as Related.

EP office action received for European Patent office application serial No. EP20201081660 dated Jan. 12, 2021, 1 page.

International Search Report and Written Opinion for International Application No. PCT/EP2020/081660 dated Feb. 19, 2021, 12 pages.

Niemczyk, et al., Fabrication Technology of and Symmetry Breaking in Superconduction Quantum Circuits, arxiv.org, Cornell University Library, 201 Olin Library Cornell University Ithaca, NY 14853, Jan. 23, 2009 (Jan. 23, 2009), XP080358579, DOI: 10.1088/0953-2048/22/3/034009, p. 2, last paragraph-p. 9, line 1.

Notice of Allowance for U.S. Appl. No. 16/681,295 dated Jun. 4, 2021, 39 pages.

\* cited by examiner

REMOVING AN OXIDE LAYER FROM A SURFACE OF A QUANTUM PROCESSOR — 1002

COATING A SUPERCONDUCTING RESONATOR POSITIONED ON A SILICON SUBSTRATE WITH A METAL FLUORIDE LAYER TO ENHANCE A QUALITY FACTOR OF THE SUPERCONDUCTING RESONATOR, WHEREIN THE SUPERCONDUCTING RESONATOR AND THE SILICON SUBSTRATE FORM THE SURFACE OF THE QUANTUM PROCESSOR — 1004

_US 11,158,782 B2_

METAL FLUORIDE ENCAPSULATION OF SUPERCONDUCTING DEVICES

BACKGROUND

The subject disclosure relates to metal fluoride encapsulation of one or more superconducting devices, and more specifically, to encapsulating one or more superconducting resonators and/or qubits of a quantum processor with one or more metal fluoride layers.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods that can regard encapsulating of one or more superconducting devices of a quantum processor with one or more metal fluoride layers are described.

According to an embodiment, a method is provided. The method can comprise depositing a metal fluoride layer onto a superconducting resonator and a silicon substrate that can be comprised within a quantum processor. The superconducting resonator can be positioned on the silicon substrate. Also, the metal fluoride layer can coat the superconducting resonator.

According to an embodiment, another method is provided. The method can comprise removing an oxide layer from a surface of a quantum processor. The method can also comprise coating a superconducting resonator positioned on a silicon substrate with a metal fluoride layer to enhance a quality factor of the superconducting resonator. The superconducting resonator and the silicon substrate can form the surface of the quantum processor.

According to an embodiment, a quantum processor is provided. The quantum processor can comprise a metal fluoride layer coating a superconducting resonator and a surface of a silicon substrate. The superconducting resonator can be positioned on the surface of the silicon substrate.

BRIEF DESCRIPTION OF THE DRAWINGS

FIG. 10 illustrates a flow diagram of an example, non-limiting method that can facilitate manufacturing one or more metal fluoride encapsulated quantum processors in accordance with one or more embodiments described herein.

DETAILED DESCRIPTION

Figure 1:
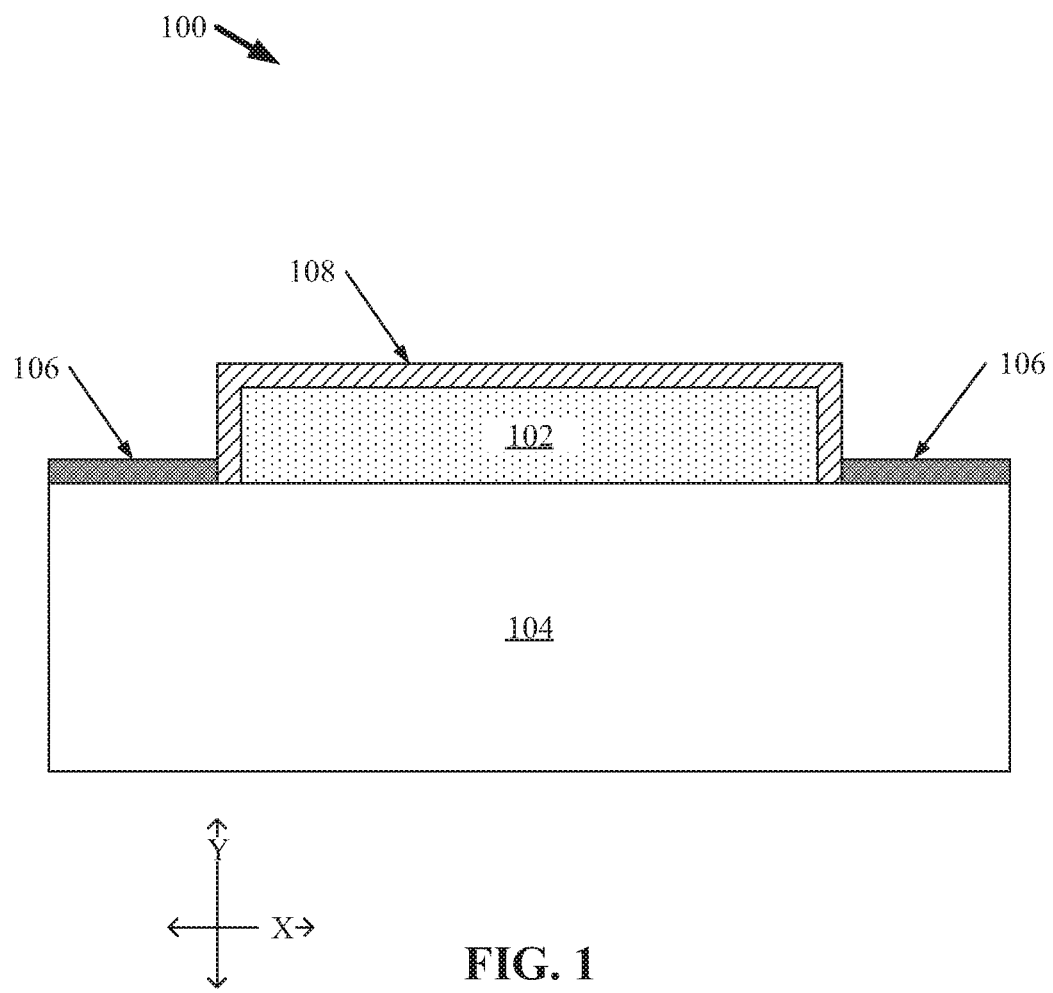
FIG. 1 illustrates a diagram of an example, non-limiting metal fluoride encapsulated quantum processor during a first stage of manufacturing in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum processors can comprise a plurality of superconducting qubits connected to one or more superconducting resonators deposited on highly resistive substrate. Through appropriate device architecture and design, the lifetime of the wavefunction within the qubit has improved to several hundred microseconds, but additional increases in the lifetime of the wavefunction have not been realized. The wavefunction itself oscillates at a radio frequency ("RF") of about 5 gigahertz ("GHz"). At this frequency, absorption of RF photons within the oxides that form both during device fabrication, and extended presence in the atmosphere, can significantly impact the lifetime of the qubits. For example, oxide layers that forms on the surface of the substrate and/or the superconducting resonator lines absorb strongly in the RF regime. While the oxides can be removed via an etching treatment, regrowth of the oxides can occur rapidly in ambient atmosphere.

Various embodiments described herein can include apparatuses and/or methods regarding the implementation of one or more metal fluoride layers to encapsulate one or more superconducting devices of a quantum processor. For example, in one or more embodiments metal fluoride layers can be deposited onto one or more superconducting resonators, superconducting qubits, and/or a silicon substrate of a quantum processor. The metal fluoride layers can prevent the regrowth of one or more oxides on the quantum processor and/or can decrease the amount of RF absorption experienced by the quantum processor.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials can be used in the various embodiments described herein.

FIG. 1 illustrates a diagram of an example, non-limiting quantum processor 100 during a first stage of manufacturing in accordance with one or more embodiments described herein. Repetitive description of like elements employed in other embodiments described herein is omitted for sake of brevity. As shown in FIG. 1, during the first stage of manufacturing, one or more superconducting resonators 102 can be deposited onto a silicon substrate 104 via one or more deposition processes. Additionally, in various embodiments, one or more qubits can be deposited onto the silicon substrate 104.

The one or more superconducting resonators 102 can extend across the silicon substrate 104 connecting one or more qubits. For example, the one or more superconducting resonators 102 can function as transmission lines for the quantum processor 100. Example materials that can comprise the one or more superconducting materials can include, but are not limited to: niobium (Nb), aluminum (Al), alloys thereof, a combination thereof, and/or the like. The one or more superconducting resonators 102 can have an exemplary thickness (e.g., along the "Y" direction shown in FIG. 1) that is greater than or equal to 0.5 nanometer (nm) and less than or equal to 1 micron. In various embodiments, the one or more superconducting resonators 102, and/or one or more qubits, can be positioned on highly resistive silicon of the silicon substrate 104. In some embodiments, the silicon substrate 104 can be a silicon-on-insulator ("SOI") or silicon-on-sapphire ("SOS") wafer, wherein the one or more superconducting resonators 102, and/or one or more qubits, can be positioned on a silicon layer of the wafer.

As shown in FIG. 1, one or more native oxide layers can be formed on one or more surfaces of the silicon substrate 104 and/or superconducting resonators 102. The one or more oxide layers can form from an interaction between the quantum processor 100 and the ambient environment. For example, one or more first oxide layers 106 can form on a device surface (e.g., the surface upon which the one or more superconducting resonators 102 and/or qubits can be located) of the silicon substrate 104. For instance, the one or more first oxide layers 106 can comprise silicon dioxide formed from an interaction between the silicon of the silicon substrate 104 and oxygen in the ambient environment. The one or more first oxide layers 106 can have an exemplary thickness (e.g., along the "Y" direction shown in FIG. 1) that is greater than or equal to 0.5 nanometers (nm) and less than or equal to 10 nm. Further, one or more second oxide layers 108 can form on one or more sides of the one or more superconducting resonators 102. For instance, wherein the one or more superconducting resonators 102 comprise niobium, the one or more second oxide layers 108 can comprise: niobium monoxide, niobium dioxide, niobium pentoxide, a combination thereof, and/or the like. The one or more second oxide layers 108 can have an exemplary thickness (e.g., along the "Y" direction shown in FIG. 1) that is greater than or equal to 0.5 nm and less than or equal to 10 nm (e.g., a thickness of 5 nm).

Figure 2:
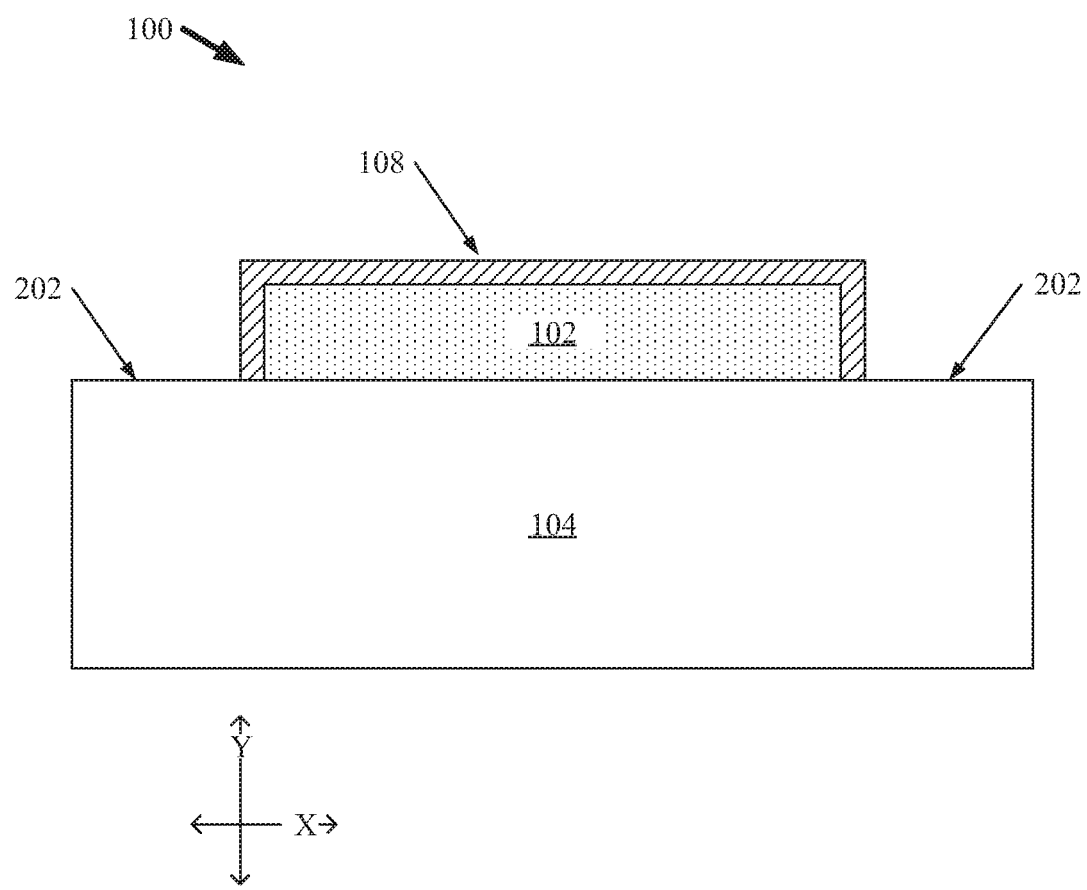
FIG. 2 illustrates a diagram of an example, non-limiting metal fluoride encapsulated quantum processor during a second stage of manufacturing in accordance with one or more embodiments described herein.

FIG. 2 illustrates a diagram of an example, non-limiting quantum processor 100 during a second stage of manufacturing in accordance with one or more embodiments described herein. Repetitive description of like elements employed in other embodiments described herein is omitted for sake of brevity. As shown in FIG. 2, during the second stage of manufacturing, the one or more first oxide layers 106 can be removed from the silicon substrate 104 via one or more etching processes. For example, one or more silicon dioxide layers can be removed from the device surface of the silicon substrate 104 to define one or more oxide-free surfaces 202 of the quantum processor 100.

In one or more embodiments, the one or more first oxide layers 106 can be removed from the silicon substrate 104 using a hydrofluoric acid ("HF") or trifluoroacetic acid ("TFA") solution in one or more etching processes. For example, the quantum processor 100 can be dipped into an etching solution comprising 10% HF for a period of time that is, for instance, greater than or equal to 10 seconds and less than or equal to 1 minute. The one or more etching processes (e.g., utilizing a dilute HF or TFA solution) can remove the one or more first oxide layers 106 (e.g., silicon dioxide layers), wherein hydrogen can further terminate on the surface of the silicon substrate 104 and inhibit re-growth of the one or more first oxide layers 106 for a period of time (e.g., for several minutes). Thereby, the one or more etching processes can render an oxide-free surface 202 of the silicon substrate 104.

In some embodiments, the one or more first oxide layers 106 can be removed from the silicon substrate 104 via one or more annealing processes. For instance, the quantum processor 100, including the silicon substrate 104, can be heated to a temperature greater than or equal to 250 degrees Celsius (° C.) and less than or equal to 480° C. The annealing process can remove the one or more first oxide layers 106 (e.g., comprising silicon oxide) without damaging the one or more superconducting resonators 102 and/or qubits of the quantum processor 100. Additionally, the annealing process can remove water deposited onto the quantum processor 100 from the ambient environment.

Figure 3:
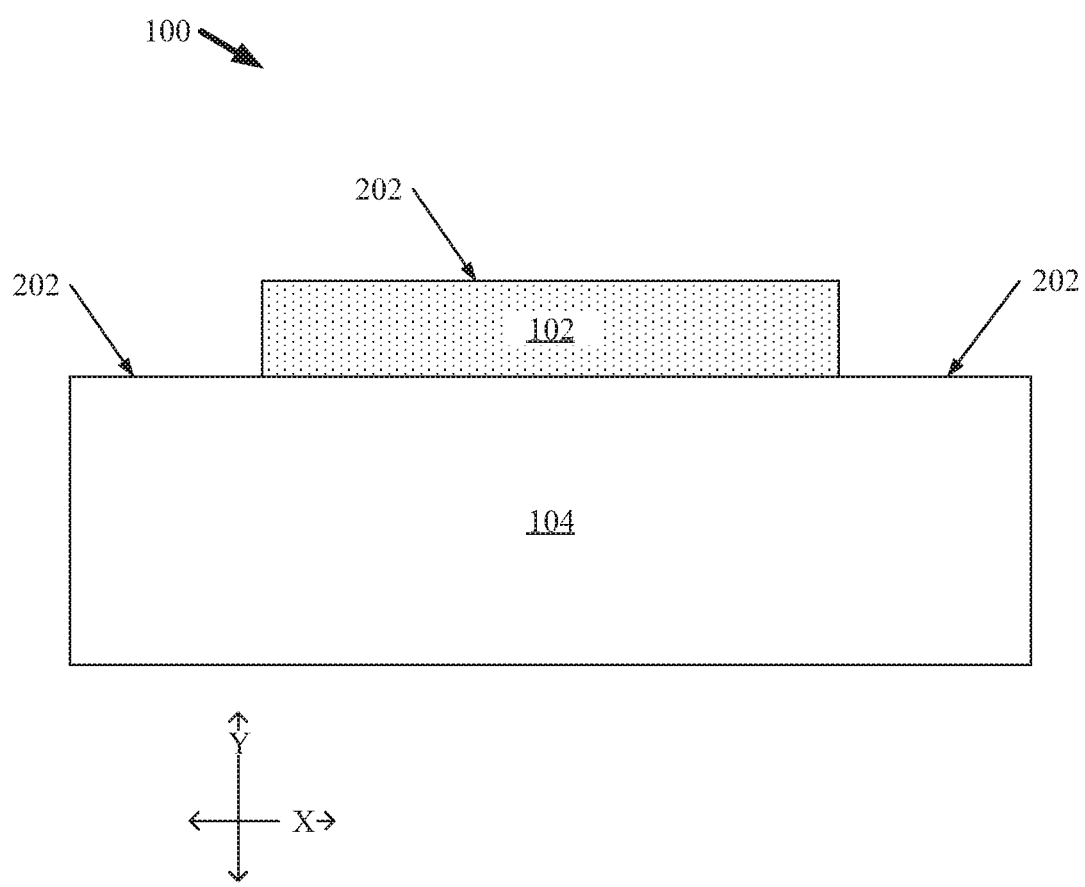
FIG. 3 illustrates a diagram of an example, non-limiting metal fluoride encapsulated quantum processor during a third stage of manufacturing in accordance with one or more embodiments described herein.

FIG. 3 illustrates a diagram of an example, non-limiting quantum processor 100 during a third stage of manufacturing in accordance with one or more embodiments described herein. Repetitive description of like elements employed in other embodiments described herein is omitted for sake of brevity. As shown in FIG. 3, during the third stage of manufacturing, the one or more second oxide layers 108 can be removed from the one or more superconducting resonators 102 via one or more etching processes and/or annealing processes. For example, one or more niobium oxide layers can be removed from one or more surfaces of the one or more superconducting resonators 102 to further define one or more oxide-free surfaces 202 of the quantum processor 100.

In one or more embodiments, the one or more second oxide layers 108 can be removed during the same etching process that removes the one or more first oxide layers 106. For example, the one or more second oxide layers 108 can be removed during etching by the diluted HF etching solution that can remove the one or more first oxide layers 106. Further, the etching process can be performed within a nitrogen glove box having an oxygen partial pressure of about 1 part per million so as to inhibit regrowth of the one or more second oxide layers 108 on the one or more superconducting resonators 102. In various embodiments, the etching process can further remove one or more oxide layers from one or more qubits of the quantum processor 100 (e.g., which can be coupled to the one or more superconducting resonators 102 and/or positioned on the silicon substrate 104).

In one or more embodiments, the one or more second oxide layers 108 can be removed via an annealing process (e.g., performed after the etching process that can remove the one or more first oxide layers 106). For example, following the etching process that removes the one or more first oxide layers 106, the quantum processor 100 can be inserted into a vacuum system where regrowth of the one or more first oxide layers 106 can be prevented. Further, the quantum processor 100 can be annealed within the vacuum system for a period of time (e.g., a period of time less than or equal to 1 minute). For instance, the quantum processor 100, including the one or more superconducting resonators 102, can be heated to a temperature greater than or equal to 250 degrees Celsius (° C.) and less than or equal to 480° C. The annealing process can remove the one or more second oxide layers 108 (e.g., comprising niobium pentoxide) without damaging the one or more superconducting resonators 102 and/or qubits of the quantum processor 100. Additionally, the annealing process can remove water deposited onto the quantum processor 100 from the ambient environment.

In various embodiments, the quantum processor 100 can be subject to one or more etching processes and annealing processes in accordance with the embodiments described herein. For example, the one or more first oxide layers 106 can be removed via one or more etching and/or annealing processes, which can also remove the one or more second oxide layers 108. In another example, the one or more first oxide layers 106 can be removed via one or more etching and/or annealing processes, wherein the one or more second oxide layers 108 can be removed via one or more other etching and/or annealing processes. As a result of the one or more etching processes and/or annealing processes, a device surface of the quantum processor 100 (e.g., comprising the silicon substrate 104, the one or more superconducting resonators 102, and/or the one or more qubits) can be rendered an oxide-free surface 202 (e.g., as shown in FIG. 3).

The one or more native oxide layers (e.g., first oxide layers 106 and/or second oxide layers 108) can strongly absorb RF energy at 5 GHz, which can be the resonate frequency of the quantum processor 100. Once the oxide layers are removed, RF is no longer absorbed by the oxides and the quality factor ("Q") of the one or more superconducting resonators 102 can increase; thereby increasing the relaxation times ("T1" and/or "T2") of the quantum processor's 100 qubit wavefunction.

Figure 4:
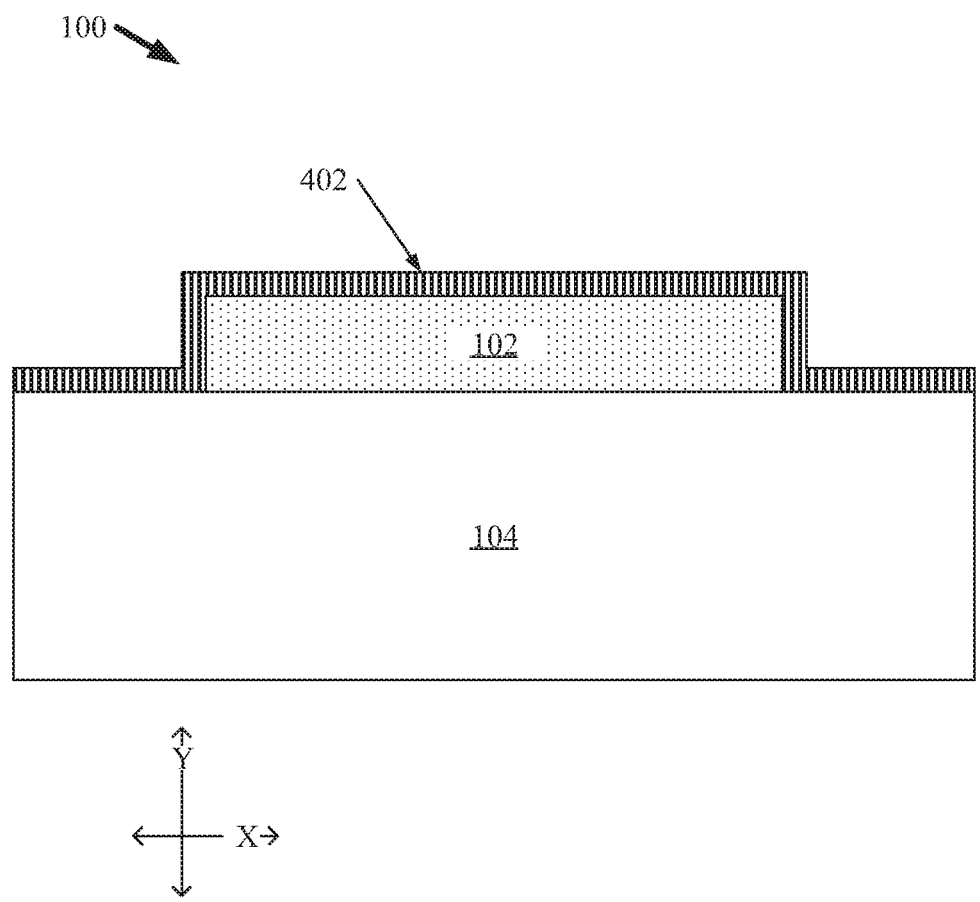
FIG. 4 illustrates a diagram of an example, non-limiting metal fluoride encapsulated quantum processor during a fourth stage of manufacturing in accordance with one or more embodiments described herein.

FIG. 4 illustrates a diagram of an example, non-limiting quantum processor 100 during a fourth stage of manufacturing in accordance with one or more embodiments described herein. Repetitive description of like elements employed in other embodiments described herein is omitted for sake of brevity. As shown in FIG. 4, during the fourth stage of manufacturing, one or more metal fluoride layers 402 can be deposited onto the one or more oxide-free surfaces 202 of the quantum processor 100.

For example, the one or more metal fluoride layers 402 can be deposited onto the silicon substrate 104, the one or more superconducting resonators 102, and/or the one or more qubits. For instance, the one or more metal fluoride layers 402 can be deposited onto surfaces of the quantum processor 100 where oxide layers (e.g., one or more first oxide layers 106 and/or second oxide layers 108) were removed via one or more etching and/or annealing processes. In one or more embodiments, the one or more metal fluoride layers 402 can encapsulate the one or more superconducting resonators 102 and/or qubits on the silicon substrate 104.

For example, the one or more metal fluoride layers 402 can be deposited onto the silicon substrate 104, one or more superconducting resonators 102, and/or one or more qubits of the quantum processor 100 via thermal evaporation. For instance, the one or more metal fluoride layers 402 can evaporate congruently (e.g., evaporating or subliming as a molecule). In various embodiments, the one or more metal fluoride layers 402 can be deposited, via one or more deposition processes (e.g., thermal evaporation), onto the components of the quantum processor 100 within a vacuum system (e.g., wherein the vacuum system can prevent regrowth of one or more oxide layers). Example materials that can comprise the one or more metal fluoride layers 402 can include, but are not limited to: calcium fluoride, lithium fluoride, manganese fluoride, iron fluoride, cobalt fluoride, nickel fluoride, copper fluoride, a combination thereof, and/or the like. Additionally, the one or more metal fluoride layers 402 can have an exemplary thickness (e.g., along the "Y" direction shown in FIG. 5) that is greater than or equal to 1 nm and less than or equal to 30 nm. In various embodiments, the one or more metal fluoride layers 402 can: encapsulate the one or more superconducting resonators 102, encapsulate one or more qubits of the quantum processor 100, coat the oxide-free surface 202 of the silicon substrate 104, inhibit regrowth of one or more oxide layers (e.g., the one or more first oxide layers 106 and/or second oxide layers 108), reduce absorption of RF by the quantum processor 100 (e.g., via the one or more encapsulations and/or coatings), and/or a combination thereof.

In various embodiments, the one or more metal fluoride layers 402 can be characterized by an absorption value of 5 GHz RF that is up to about 1,000 times weaker than that of the one or more oxide layers (e.g., first oxide layers 106 and/or second oxide layers 108) native to the quantum processor 100 (e.g., formed via interaction with the ambient environment). Additionally, in some embodiments the one or more metal fluoride layers 402 (e.g., such as calcium fluoride) can be water insoluble, impermeable to atmospheric gases, and/or can resist oxidation in an ambient environment surrounding the quantum processor 100. Thereby, removal of the native oxides (e.g., one or more first oxide layers 106 and/or second oxide layers 108) and encapsulation of the one or more superconducting resonators 102 (e.g., with the one or more metal fluoride layers 402) can increase the quality factor of the one or more superconducting resonators 102 and/or thereby improve operation of the one or more qubits.

Figure 5:
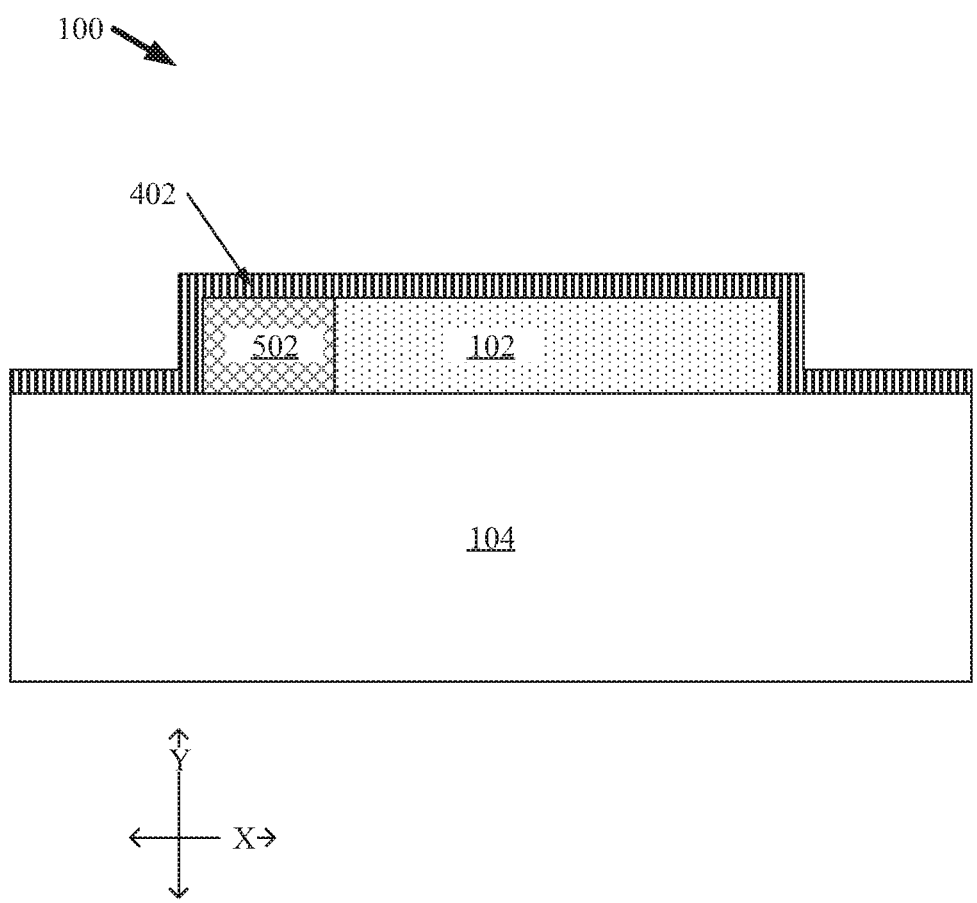
FIG. 5 illustrates a diagram of an example, non-limiting metal fluoride encapsulated quantum processor comprising one or more superconducting qubits positioned on a silicon substrate and operably coupled to one or more superconducting resonators in accordance with one or more embodiments described herein.

FIG. 5 illustrates a diagram of an example, non-limiting quantum processor 100 during the fourth stage of manufacturing and comprising one or more superconducting qubits 502 in accordance with one or more embodiments described herein. Repetitive description of like elements employed in other embodiments described herein is omitted for sake of brevity. As shown in FIG. 5, the quantum processor 100 can comprise one or more superconducting qubits 502, which can comprise one or more Josephson junctions positioned on the silicon substrate 104 and/or operably coupled to the one or more superconducting resonators 102.

In various embodiments, one or more oxides can be removed from the one or more superconducting qubits 502 (e.g., via the second and/or third stages of manufacturing described herein), and/or the one or more metal fluoride layers 402 can be further deposited over the one or more superconducting qubits 502 (e.g., via the fourth stage of manufacturing described herein, as shown in FIG. 5). Thereby, the one or more metal fluoride layers 402 can further encapsulate the one or more superconducting qubits 502 on the silicon substrate 104.

Figure 6:
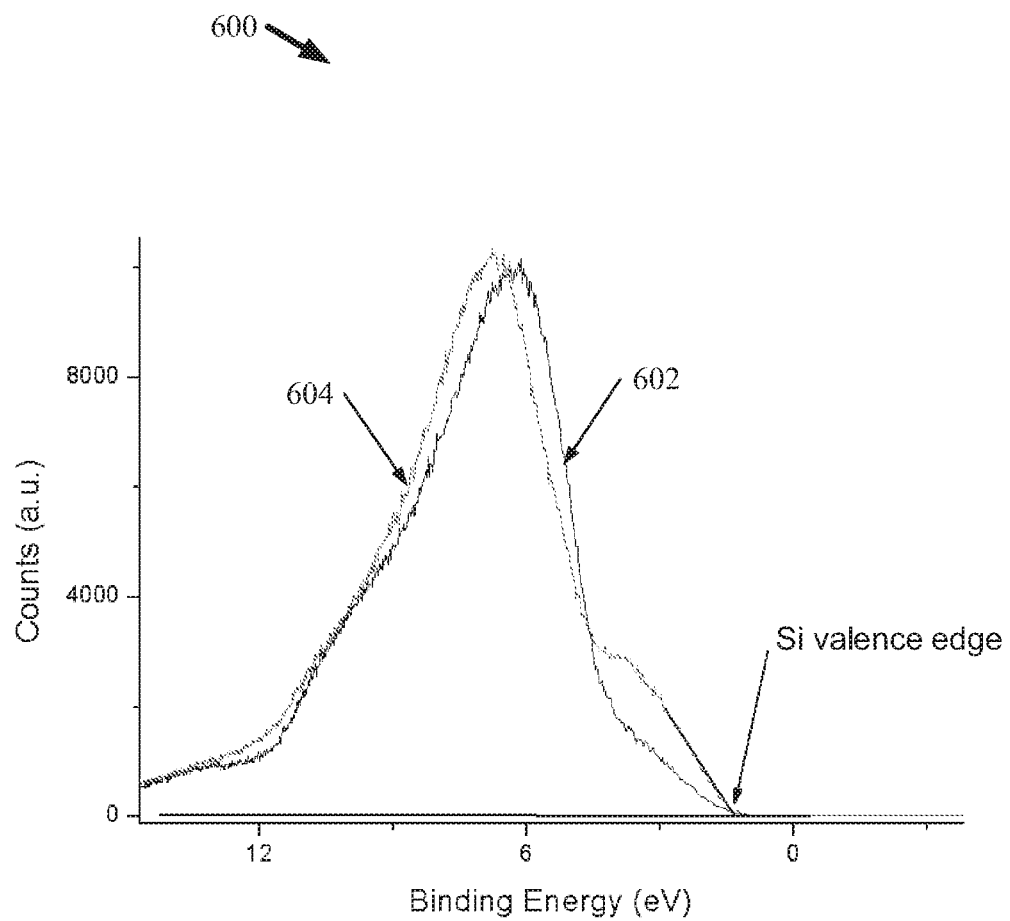
FIG. 6 illustrates a diagram of an example, non-limiting graph that can characterize the removal of one or more oxide layers from a silicon substrate of a quantum processor in accordance with one or more embodiments described herein.

FIG. 6 illustrates a diagram of an example, non-limiting graph 600 that can depict the efficacy of implementing one or more etching and/or annealing processes to remove the one or more first oxide layers 106 from the silicon substrate 104 in accordance with one or more embodiments described herein. Repetitive description of like elements employed in other embodiments described herein is omitted for sake of brevity. As shown in FIG. 6, a first line 602 can characterize the silicon substrate 104 after one or more etching processes that utilized a dilute solution of HF in accordance with one or more embodiments described herein. Also shown in FIG. 6, a second line 604 can characterize the HF etched silicon substrate 104 after an annealing at 450° C. (e.g., to remove one or more second oxide layers 108). As shown in FIG. 6, the one or more etching processes can remove a majority of the one or more first oxide layers 106, whereupon the one or more annealing processes can further remove a residual portion of the one or more first oxide layers 106.

Figure 7:
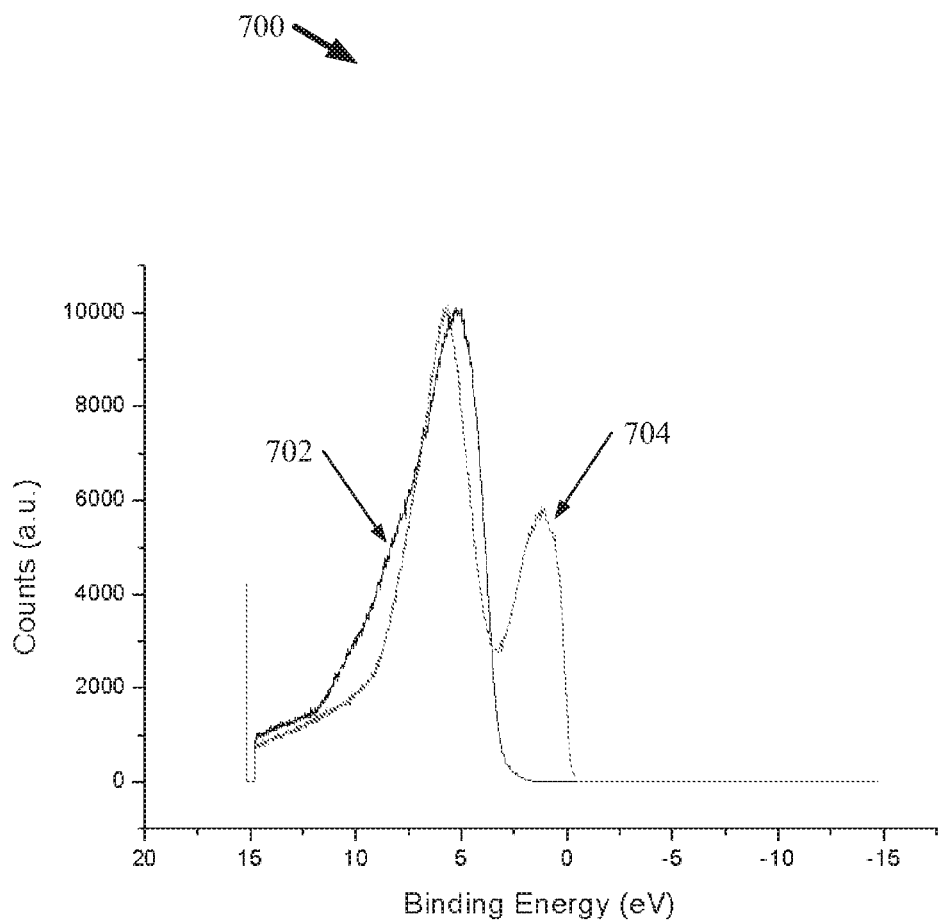
FIG. 7 illustrates a diagram of an example, non-limiting graph that can characterize the removal of one or more oxide layers from one or more superconducting resonators of a quantum processor in accordance with one or more embodiments described herein.

FIG. 7 illustrates a diagram of an example, non-limiting graph 700 that can depict the efficacy of implementing one or more etching and/or annealing processes to remove the one or more second oxide layers 108 from the one or more superconducting resonators 102 in accordance with one or more embodiments described herein. Repetitive description of like elements employed in other embodiments described herein is omitted for sake of brevity. As shown in FIG. 7, a third line 702 can characterize the one or more superconducting resonators 102 prior to one or more annealing processes. Also shown in FIG. 7, a fourth line 704 can characterize the one or more superconducting resonators 102 after an annealing at 450° C. (e.g., to remove one or more second oxide layers 108). As shown in FIG. 7, the one or more annealing processes can be effective in removing the one or more second oxide layers (e.g., comprising one or more niobium oxides.

Figure 8:
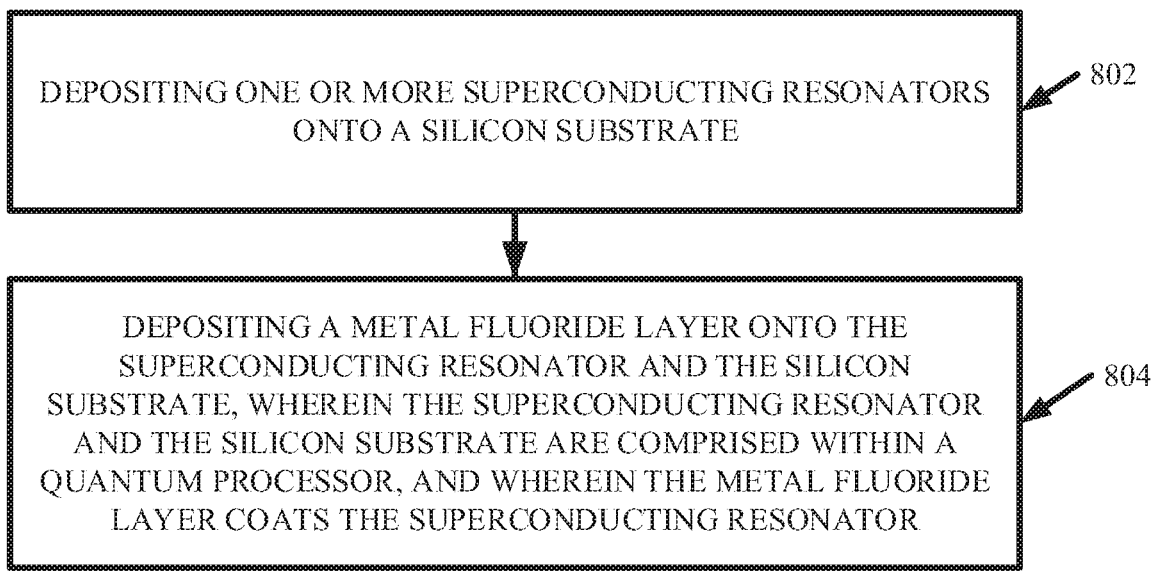
FIG. 8 illustrates a flow diagram of an example, non-limiting method that can facilitate manufacturing one or more metal fluoride encapsulated quantum processors in accordance with one or more embodiments described herein.

FIG. 8 illustrates a flow diagram of an example, non-limiting method 800 that can facilitate manufacturing one or more quantum processors 100 that can comprise one or more one or more superconducting device encapsulations with metal fluoride in accordance with one or more embodiments described herein. Repetitive description of like elements employed in other embodiments described herein is omitted for sake of brevity.

At 802, the method 800 can comprise depositing one or more superconducting resonators 102 onto a silicon substrate 104. As described herein, the one or more superconducting resonators 102 and/or the silicon substrate 104 can be comprised within a quantum processor 100. Further, one or more superconducting qubits 502 (e.g., comprising one or more Josephson junctions) can be positioned on the silicon substrate 104 and/or coupled to the one or more superconducting resonators 102. In various embodiments, the one or more superconducting resonators 102 can traverse a device surface of the silicon substrate 104 connecting one or more of the superconducting qubits 502. For example, the depositing at 802 can be performed in accordance with the first stage of manufacturing described herein.

At 804, the method 800 can comprise depositing one or more metal fluoride layers 402 onto the one or more superconducting resonators 102 and/or the silicon substrate 104, wherein the one or more superconducting resonators 102 the silicon substrate 104 can be comprised within the quantum processor 100, and wherein the one or more metal fluoride layers 402 can coat the one or more superconducting resonators 102. For example, the depositing at 804 can be performed in accordance with the fourth stage of manufacturing described herein. For instance, the one or more metal fluoride layers 402 can be deposited onto one or more oxide-free surfaces 202 of the one or more superconducting resonators 102 and/or silicon substrate 104. In various embodiments, the one or more metal fluoride layers 402 can further be deposited onto one or more superconducting qubits 502 of the quantum processor 100, wherein the one or more superconducting qubits 502 can also be positioned on the silicon substrate 104 and/or can be coupled to the one or more superconducting resonators 102.

In one or more embodiments, the one or more metal fluoride layers 402 can be deposited onto the quantum processor 100 via thermal evaporation. For instance, the one or more metal fluoride layers 402 can evaporate congruently (e.g., evaporating or subliming as a molecule) onto the quantum processor 100 (e.g., onto the one or more superconducting resonators 102, the one or more superconducting qubits 502, and/or the silicon substrate 104).

Further, in one or more embodiments the method 800 can further comprising removing one or more oxide layers (e.g., first oxide layers 106 and/or second oxide layers 108) from the quantum processor 100 to define the one or more oxide-free surfaces upon which the deposition at 804 can occur. For example, the one or more oxide layers (e.g., first oxide layers 106, second oxide layers 108, and/or oxide layers on the superconducting qubits 502) can be removed via an etching process (e.g., using a solution of HF and/or TFA), an annealing process (e.g., at a temperature greater than or equal to 250° C. and less than or equal to 480° C.), and/or a combination of both one or more etching processes and/or annealing processes. The one or more metal fluoride layers 402 can be characterized by an absorption value of 5 GHz RF that is up to about 1,000 times weaker than that of one or more oxide layers (e.g., first oxide layers 106 and/or second oxide layers 108) native to the quantum processor 100 (e.g., formed via interaction with the ambient environment). Additionally, in some embodiments the one or more metal fluoride layers 402 (e.g., such as calcium fluoride) can be water insoluble, impermeable to atmospheric gases, and/or can resist oxidation in an ambient environment surrounding the quantum processor 100. Thereby, removal of the native oxides (e.g., one or more first oxide layers 106 and/or second oxide layers 108) and encapsulation of the one or more superconducting resonators 102 (e.g., with the metal fluoride layers 402) can increase the quality factor of the one or more superconducting resonators 102 and/or thereby improve operation of the one or more qubits.

Figure 9:
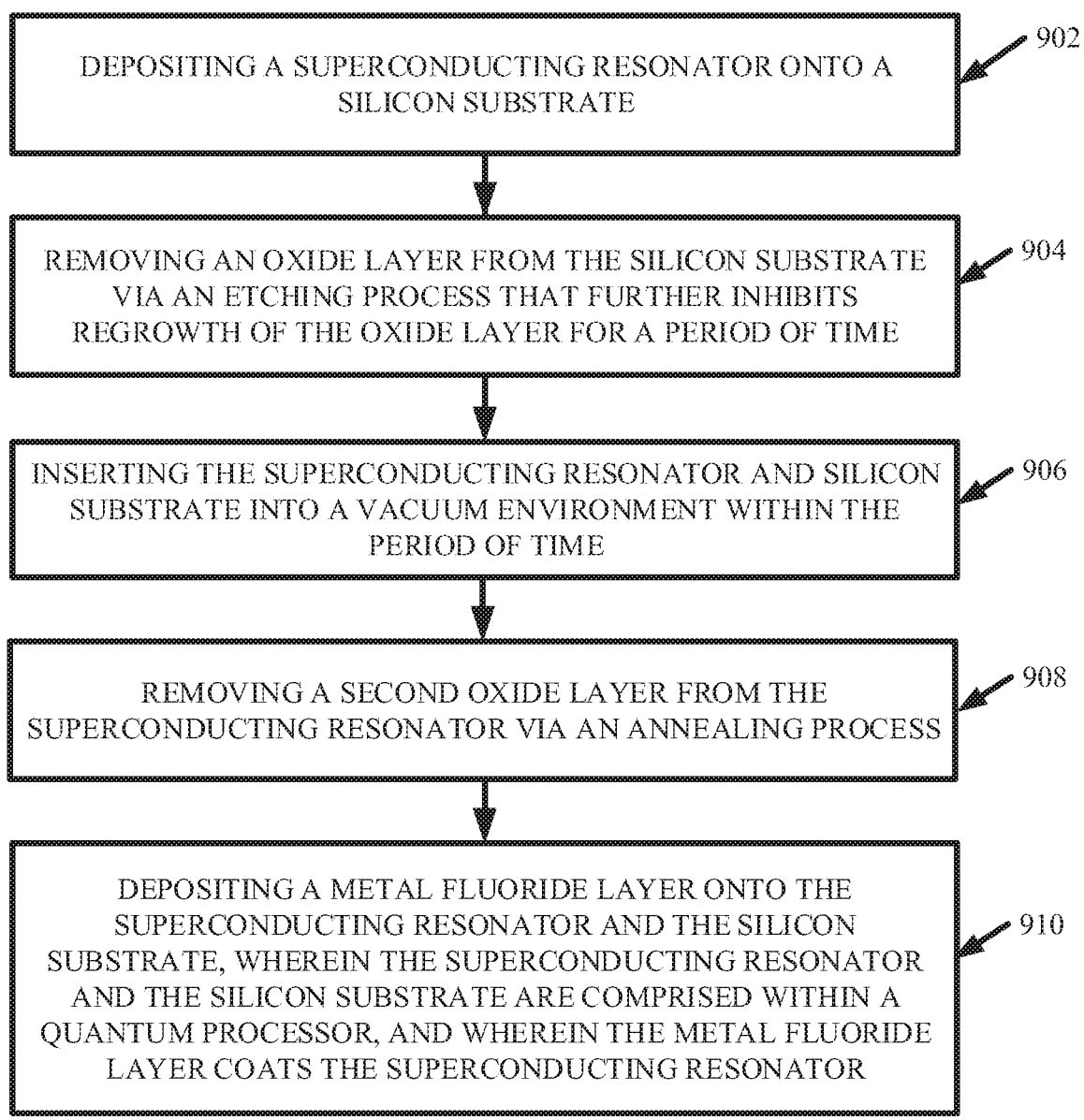
FIG. 9 illustrates a flow diagram of an example, non-limiting method that can facilitate manufacturing one or more metal fluoride encapsulated quantum processors in accordance with one or more embodiments described herein.

FIG. 9 illustrates a flow diagram of an example, non-limiting method 900 that can facilitate manufacturing one or more quantum processors 100 that can comprise one or more one or more superconducting device encapsulations with metal fluoride in accordance with one or more embodiments described herein. Repetitive description of like elements employed in other embodiments described herein is omitted for sake of brevity.

At 902, the method 900 can comprise depositing one or more superconducting resonators 102 onto a silicon substrate 104. As described herein, the one or more superconducting resonators 102 and/or the silicon substrate 104 can be comprised within a quantum processor 100. Further, one or more superconducting qubits 502 (e.g., comprising one or more Josephson junctions) can be positioned on the silicon substrate 104 and/or coupled to the one or more superconducting resonators 102. In various embodiments, the one or more superconducting resonators 102 can traverse a device surface of the silicon substrate 104 connecting one or more of the superconducting qubits 502. For example, the depositing at 902 can be performed in accordance with the first stage of manufacturing described herein.

At 904, the method 900 can comprise removing one or more oxide layers (e.g., first oxide layers 106) from the silicon substrate 104 via one or more etching processes that can further inhibit regrowth of the one or more oxide layers for a period of time. For example, removing the one or more oxide layers at 904 can be performed in accordance with the second stage of manufacturing described herein. For example, the one or more oxide layers (e.g., first oxide layers 106) can comprise one or more silicon oxides, such as silicon dioxide. Further, the one or more etching processes can employ a dilute etchant solution comprising HF and/or TFA. As described herein the etchant solution can terminate on the silicon substrate 104 so as to inhibit regrowth of the silicon oxide for the period of time. In various embodiments, the one or more etching processes can inhibit regrowth of the one or more oxide layers (e.g., first oxide layers 106) for up to several minutes. Additionally, removing the oxide layers at 904 can define one or more oxide-free surfaces 202 of the silicon substrate 104 (e.g., as shown in FIG. 2).

At 906, the method 900 can comprise inserting the one or more superconducting resonators 102 and/or the silicon substrate 104 into a vacuum environment within the period of time of inhibited oxide regrowth. For example, a lack of oxygen in the vacuum environment can enable further processing of the one or more superconducting resonators 102 without regrowth of the oxide layers (e.g., first oxide layers 106) upon the silicon substrate 104.

At 908, the method 900 can comprise removing one or more second oxide layers 108 from the one or more superconducting resonators via one or more annealing processes. For example, removing the one or more second oxide layers 108 at 908 can be performed in accordance with the third stage of manufacturing described herein. For instance, wherein niobium is comprised within the one or more superconducting resonators 102, the one or more second oxide layers 108 can comprise of niobium monoxide, niobium dioxide, and/or niobium pentoxide. Further, the annealing can be performed within the vacuum environment of 906. Also, the annealing can be performed at a temperature that is greater than or equal to 250° C. and less than or equal to 480° C. (e.g., at 450° C.). In various embodiments, the annealing can remove the one or more second oxide layers 108 without damaging the superconducting components of the quantum processor 100 (e.g., the one or more superconducting resonators 102 and/or superconducting qubits 502).

In various embodiments, the method 900 can also comprise removing one or more oxide layers from one or more superconducting qubits 502 of the quantum processor 100. For example, one or more surfaces of the one or more superconducting qubits 502 can be rendered oxide-free via the one or more etching and/or annealing processes of 904 and/or 908. The various oxide layers removed from the quantum processor 100 can exhibit strong RF absorption at the oscillating frequency of the quantum processor 100 (e.g., 5 GHz). Thus, removing the oxide layers can improve one or more operating parameters of the quantum processor 100.

At 910, the method 900 can comprise depositing one or more metal fluoride layers 402 onto the one or more superconducting resonators 102 and/or the silicon substrate 104, wherein the one or more superconducting resonators 102 and/or the silicon substrate 104 can be comprised within the quantum processor 100, and wherein the one or more metal fluoride layers 402 can coat the one or more superconducting resonators 102. For example, the depositing at 910 can be performed in accordance with the fourth stage of manufacturing described herein. For instance, the one or more metal fluoride layers 402 can be deposited onto one or more oxide-free surfaces 202 of the one or more superconducting resonators 102 and/or silicon substrate 104 (e.g., defined by the removing of oxide layers at 904 and/or 908). In various embodiments, the one or more metal fluoride layers 402 can further be deposited onto one or more superconducting qubits 502 of the quantum processor 100, wherein the one or more superconducting qubits 502 can also be positioned on the silicon substrate 104 and/or can be coupled to the one or more superconducting resonators 102.

The one or more metal fluoride layers 402 can be characterized by an absorption value of 5 GHz RF that is up to about 1,000 times weaker than that of one or more oxide layers (e.g., first oxide layers 106 and/or second oxide layers 108) removed from the quantum processor 100 (e.g., formed via interaction with the ambient environment). Additionally, in some embodiments the one or more metal fluoride layers 402 (e.g., such as calcium fluoride) can be water insoluble, impermeable to atmospheric gases, and/or can resist oxidation in an ambient environment surrounding the quantum processor 100. Thereby, encapsulation of the one or more superconducting resonators 102 (e.g., with the silicon substrate 104 and metal fluoride layers 402) can increase the quality factor of the one or more superconducting resonators 102 and/or improve operation of the one or more superconducting qubits 502.

FIG. 10 illustrates a flow diagram of an example, non-limiting method 1000 that can facilitate manufacturing one or more quantum processors 100 that can comprise one or more one or more superconducting device encapsulations with metal fluoride in accordance with one or more embodiments described herein. Repetitive description of like elements employed in other embodiments described herein is omitted for sake of brevity.

At 1002, the method 1000 can comprise removing one or more oxide layers (e.g., first oxide layers 106 and/or second oxide layers 108) from one or more surfaces of a quantum processor 100. For example, removing the one or more oxide layers at 1002 can be performed in accordance with the second and/or third manufacturing steps described herein. For instance, one or more etching processes, annealing process, and/or a combination thereof can be employed to facilitate removal of the one or more oxide layers. In various embodiments, oxide layers can be removed from surfaces of one or more superconducting resonators 102, silicon substrates 104, and/or superconducting qubits 502. For example, the oxide layers can comprise silicon oxides (e.g., silicon dioxide) and/or niobium oxides (e.g., niobium monoxide, niobium dioxide, and/or niobium pentoxide).

At 1004, the method 1000 can comprise coating the one or more superconducting resonators 102 positioned on the silicon substrate 104 with one or more metal fluoride layers 402 to enhance a quality factor of the one or more superconducting resonators 102, wherein the one or more superconducting resonators 102 and/or the silicon substrate 104 can form the surface of the quantum processor 100 (e.g., a surface of the quantum processor comprising one or more superconducting devices, such as superconducting resonators 102 and/or superconducting qubits 502). For example, the coating at 1004 can be performed in accordance with the fourth stage of manufacturing described herein. For instance, the one or more metal fluoride layers 402 can be deposited onto the quantum processor 100 via one or more deposition processes, such as thermal evaporation. In various embodiments, the coating at 1004 can further coat one or more superconducting qubits 502 with the one or more metal fluoride layers 402, wherein the one or more superconducting qubits 502 can be positioned on the silicon substrate 104 and/or operably coupled to the one or more superconducting resonators 102. Example materials that can be comprised within the one or more metal fluoride layers 402 can include, but are not limited to: calcium fluoride, lithium fluoride, manganese fluoride, iron fluoride, cobalt fluoride, nickel fluoride, and copper fluoride.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   removing respective oxide layers from a superconducting resonator and a silicon substrate of a quantum processor being manufactured; and
   depositing a metal fluoride layer onto the superconducting resonator and the silicon substrate, wherein the superconducting resonator is positioned on the silicon substrate, and wherein the metal fluoride layer coats the superconducting resonator.

2. The method of claim 1, wherein the metal fluoride layer comprises at least one member selected from the group consisting of calcium fluoride, lithium fluoride, manganese fluoride, iron fluoride, cobalt fluoride, nickel fluoride, and copper fluoride.

3. The method of claim 1, wherein the removing the respective oxide layers comprises removing an oxide layer from the superconducting resonator in a vacuum chamber.

4. The method of claim 1, wherein the quantum processor being manufactured further comprises a qubit positioned on the silicon substrate and coupled to the superconducting resonator, and wherein the removing the respective oxide layers further comprises removing the respective oxide layer from the qubit, the superconducting resonator, and the silicon substrate.

5. The method of claim 1, wherein the removing the respective oxide layers comprises removing a first oxide layer from the silicon substrate via an etching process that further inhibits regrowth of the oxide layer for a period of time.

6. The method of claim 5, wherein the etching process comprises dipping the quantum processor being manufactured into an etchant solution comprising at least one member selected from the group consisting of hydrofluoric acid and trifluoroacetic acid.

7. The method of claim 5, wherein the removing the oxide layers further comprises removing a second oxide layer from the superconducting resonator via at least one process selected from a group consisting of an annealing process and the etching process.

8. The method of claim 7, wherein the annealing process is performed at a temperature that is greater than or equal to 250 degrees Celsius and less than or equal to 480 degrees Celsius.

9. The method of claim 7, wherein the superconducting resonator comprises niobium, and wherein the second oxide layer comprises at least one oxide member selected from the group consisting of niobium monoxide, niobium dioxide, and niobium pentoxide.

10. The method of claim 7, wherein the metal fluoride layer is characterized by a radio frequency absorption value that is less than a radio frequency absorption value of the oxide layer and a radio frequency absorption value of the second oxide layer.

11. A method, comprising:
removing an oxide layer from a surface of a quantum processor being manufactured; and
coating a superconducting resonator positioned on a silicon substrate with a metal fluoride layer to enhance a quality factor of the superconducting resonator, wherein the superconducting resonator and the silicon substrate form the surface of the quantum processor being manufactured.

12. The method of claim 11, wherein the metal fluoride layer comprises at least one member selected from the group consisting of calcium fluoride, lithium fluoride, manganese fluoride, iron fluoride, cobalt fluoride, nickel fluoride, and copper fluoride.

13. The method of claim 11, wherein the removing the oxide layer comprises removing a first portion of the oxide layer from the silicon substrate via an etching process that further inhibits regrowth of the first portion of the oxide layer for a defined period of time.

14. The method of claim 13, wherein the removing the oxide layer further comprises inserting the quantum processor being manufactured into a vacuum environment within the defined period of time to prevent the regrowth of the oxide layer.

15. The method of claim 14, wherein the removing the oxide layer further comprises removing a second portion of the oxide layer from the superconducting resonator via an annealing process performed in the vacuum environment.

16. A quantum processor, comprising:
a metal fluoride layer coating a superconducting resonator and a surface of a silicon substrate, wherein the superconducting resonator is positioned on the surface of the silicon substrate, and an interface between the metal fluoride layer and the superconducting resonator is native oxide free.

17. The quantum processor of claim 16, wherein the metal fluoride layer further coats a qubit positioned on the surface of the silicon substrate and coupled to the superconducting resonator.

18. The quantum processor of claim 16, wherein the metal fluoride layer comprises at least one member selected from the group consisting of calcium fluoride, lithium fluoride, manganese fluoride, iron fluoride, cobalt fluoride, nickel fluoride, and copper fluoride.

19. The quantum processor of claim 16, wherein the surface of the silicon substrate is oxide free.

20. The quantum processor of claim 16, wherein the metal fluoride layer has a thickness greater than or equal to 1 nanometer and less than or equal to 30 nanometers.

* * * * *